United States Patent
Hatano et al.

(10) Patent No.: US 10,332,932 B2
(45) Date of Patent: Jun. 25, 2019

(54) SOLID-STATE IMAGE PICKUP DEVICE, MANUFACTURING METHOD, AND ELECTRONIC APPARATUS

(71) Applicant: SONY CORPORATION, Tokyo (JP)

(72) Inventors: Keisuke Hatano, Kanagawa (JP); Hideaki Togashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 39 days.

(21) Appl. No.: 15/323,818

(22) PCT Filed: Jun. 26, 2015

(86) PCT No.: PCT/JP2015/068451
§ 371 (c)(1),
(2) Date: Jan. 4, 2017

(87) PCT Pub. No.: WO2016/006474
PCT Pub. Date: Jan. 14, 2016

(65) Prior Publication Data
US 2017/0162624 A1 Jun. 8, 2017

(30) Foreign Application Priority Data

Jul. 11, 2014 (JP) .................................. 2014-143275

(51) Int. Cl.
*H04N 5/225* (2006.01)
*H01L 27/148* (2006.01)
(Continued)

(52) U.S. Cl.
CPC .. *H01L 27/14806* (2013.01); *H01L 27/14603* (2013.01); *H01L 27/14614* (2013.01);
(Continued)

(58) Field of Classification Search
None
See application file for complete search history.

(56) References Cited

U.S. PATENT DOCUMENTS

2005/0194653 A1* 9/2005 Hynecek ........... H01L 27/14647 257/443
2008/0083940 A1* 4/2008 Ezaki ................. H01L 27/14603 257/292
(Continued)

FOREIGN PATENT DOCUMENTS

| JP | 4-17371 A | 1/1992 |
| JP | 11-26758 A | 1/1999 |

(Continued)

OTHER PUBLICATIONS

International Search Report prepared by the Japan Patent Office dated Aug. 10, 2015, for International Application No. PCT/JP2015/068451.

*Primary Examiner* — Twyler L Haskins
*Assistant Examiner* — Dwight Alex C Tejano
(74) *Attorney, Agent, or Firm* — Sheridan Ross P.C.

(57) ABSTRACT

The present disclosure relates to a solid-state image pickup device, a manufacturing method, and an electronic apparatus, which can obtain high charge transfer efficiency from a photoelectric conversion unit to a floating diffusion layer. The floating diffusion layer is arranged in a rectangular shape so as to surround a gate electrode of a vertical transistor whose groove portion is rectangular. A reset drain is formed so as to be adjacent to the floating diffusion layer through a reset gate. A potential of the floating diffusion layer is reset to the same potential as that of the reset drain by applying a predetermined voltage to the reset gate. It is possible to apply the present disclosure to, for example, a CMOS solid-state image pickup device used in an image pickup device such as a camera.

18 Claims, 17 Drawing Sheets

(51) Int. Cl.
  *H04N 5/374*  (2011.01)
  *H04N 5/378*  (2011.01)
  *H01L 27/146*  (2006.01)

(52) U.S. Cl.
  CPC .. *H01L 27/14616* (2013.01); *H01L 27/14638* (2013.01); *H01L 27/14641* (2013.01); *H01L 27/14689* (2013.01); *H04N 5/374* (2013.01); *H04N 5/378* (2013.01)

(56) References Cited

U.S. PATENT DOCUMENTS

| | | | | |
|---|---|---|---|---|
| 2009/0244514 A1* | 10/2009 | Jin | ............ | G01C 3/08 |
| | | | | 356/4.01 |
| 2012/0161267 A1* | 6/2012 | Ezaki | ............ | H01L 27/14603 |
| | | | | 257/431 |
| 2013/0320407 A1* | 12/2013 | Ahn | ............ | H01L 31/02 |
| | | | | 257/239 |

FOREIGN PATENT DOCUMENTS

| | | |
|---|---|---|
| JP | 2007-531254 A | 11/2007 |
| JP | 2013-16675 A | 1/2013 |
| JP | 2013-084785 | 5/2013 |
| WO | WO 2013/088983 A1 | 6/2013 |

\* cited by examiner

INCIDENT LIGHT

TO AMPLIFIER TRANSISTOR GATE

INCIDENT LIGHT

SOLID-STATE IMAGE PICKUP DEVICE, MANUFACTURING METHOD, AND ELECTRONIC APPARATUS

CROSS REFERENCE TO RELATED APPLICATIONS

This application is a national stage application under 35 U.S.C. 371 and claims the benefit of PCT Application No. PCT/JP2015/068451 having an international filing data of 26 Jun. 2015, which designated the United States, which PCT application claimed the benefit of Japanese Patent Application No. 2014-143275 filed 11 Jul. 2014, the disclosures of which are incorporated herein by reference in their entirety.

TECHNICAL FIELD

The present disclosure relates to a solid-state image pickup device, a manufacturing method, and an electronic apparatus, in particular to a solid-state image pickup device, a manufacturing method, and an electronic apparatus, which can obtain high charge transfer efficiency from a photoelectric conversion unit to a floating diffusion layer.

BACKGROUND ART

In an image pickup device such as a digital camera, a backside illumination type solid-state image pickup device is known for suppressing an incident light vignetting due to a wiring layer and obtaining high charge conversion efficiency. Further, in the backside illumination type solid-state image pickup device, a floating diffusion layer connected to a signal charge reading circuit is formed on a substrate surface opposite to a light incident surface, and as a reading structure of the signal charge from the photoelectric conversion unit to the floating diffusion layer, for example, a method using a vertical transistor shown in Patent Document 1 is disclosed.

CITATION LIST

Patent Document

Patent Document 1: Japanese Patent Application Laid-Open No. 2013-84785

SUMMARY OF THE INVENTION

Problems to be Solved by the Invention

In such a vertical transistor, regarding the signal charge from the photoelectric conversion unit, it is necessary to rotationally transfer the charge along an outer circumferential direction of a channel of the vertical transistor toward a portion where the floating diffusion layer is formed at the same time as transferring the charge from the photoelectric conversion unit to the floating diffusion layer in the depth direction of the substrate. When rotating the charge along the outer circumferential direction of the channel, it is difficult to obtain high transfer efficiency due to the existence of potential barrier and potential dip along a rotation direction of the channel.

The present disclosure is made in view of the above situation and can obtain high charge transfer efficiency from the photoelectric conversion unit to the floating diffusion layer.

Solutions to Problems

A solid-state image pickup device according to an aspect of the present technology includes: a vertical transistor that performs charge transfer from a photoelectric conversion unit formed in a semiconductor substrate to a floating diffusion layer; and the floating diffusion layer that is formed so as to surround a groove portion which is a channel region of the vertical transistor.

A gate electrode of a reset transistor for resetting a potential of the floating diffusion layer is arranged at a position adjacent to the floating diffusion layer.

An impurity density of the floating diffusion layer is formed to be uniform over an entire region of the floating diffusion layer.

An impurity density of the floating diffusion layer is formed so as to gradually increase toward a region adjacent to the gate electrode of the reset transistor.

A cross-sectional shape of the groove portion is circular.

A cross-sectional shape of the groove portion is rectangular.

A planar shape of the floating diffusion layer formed so as to surround the groove portion is rectangular.

A part of a planar shape of the floating diffusion layer formed so as to surround the groove portion is arc-shaped.

A planar shape of the floating diffusion layer formed so as to surround the groove portion is circular.

A manufacturing method according to an aspect of the present technology performed by a manufacturing device, the manufacturing method includes: forming a photoelectric conversion unit in a semiconductor substrate; and forming a groove portion and a floating diffusion layer in the semiconductor substrate in which the photoelectric conversion unit is formed so that the groove portion to be a channel region of a vertical transistor that performs charge transfer from the photoelectric conversion unit to the floating diffusion layer is surrounded by the floating diffusion layer.

A floating diffusion layer may be formed in the semiconductor substrate in which the photoelectric conversion unit is formed; and a groove portion to be a channel region of a vertical transistor may be formed in the formed floating diffusion layer.

A groove portion to be a channel region of a vertical transistor may be formed in the semiconductor substrate in which the photoelectric conversion unit is formed; and a floating diffusion layer may be formed so as to surround the formed groove portion.

An electronic apparatus according to an aspect of the present technology includes: a solid-state image pickup device including a vertical transistor that performs charge transfer from a photoelectric conversion unit formed in a semiconductor substrate to a floating diffusion layer, and the floating diffusion layer that is formed so as to surround a groove portion which is a channel region of the vertical transistor; a signal processing circuit that processes an output signal outputted from the solid-state image pickup device; and an optical system that projects incident light into the solid-state image pickup device.

In an aspect of the present technology, a groove portion and a floating diffusion layer are formed in a semiconductor substrate in which a photoelectric conversion unit is formed so that the groove portion to be a channel region of a vertical transistor that performs charge transfer from the photoelectric conversion unit to the floating diffusion layer is surrounded by the floating diffusion layer.

Effects of the Invention

According to the present technology, it is possible to manufacture a solid-state image pickup device using a vertical transistor that performs charge transfer from a photoelectric conversion unit to a floating diffusion layer. Further, according to the present technology, it is possible to obtain high charge transfer efficiency from the photoelectric conversion unit to the floating diffusion layer.

In addition, the effects described in the present description are merely illustrative and the effects of the present technology are not limited to the effects described in the present description, so that there may be additional effects.

MODE FOR CARRYING OUT THE INVENTION

Hereinafter, modes for carrying out the present disclosure (hereinafter referred to as embodiments) will be described.
<Schematic Configuration Example of Solid-State Image Pickup Device>

Figure 1:
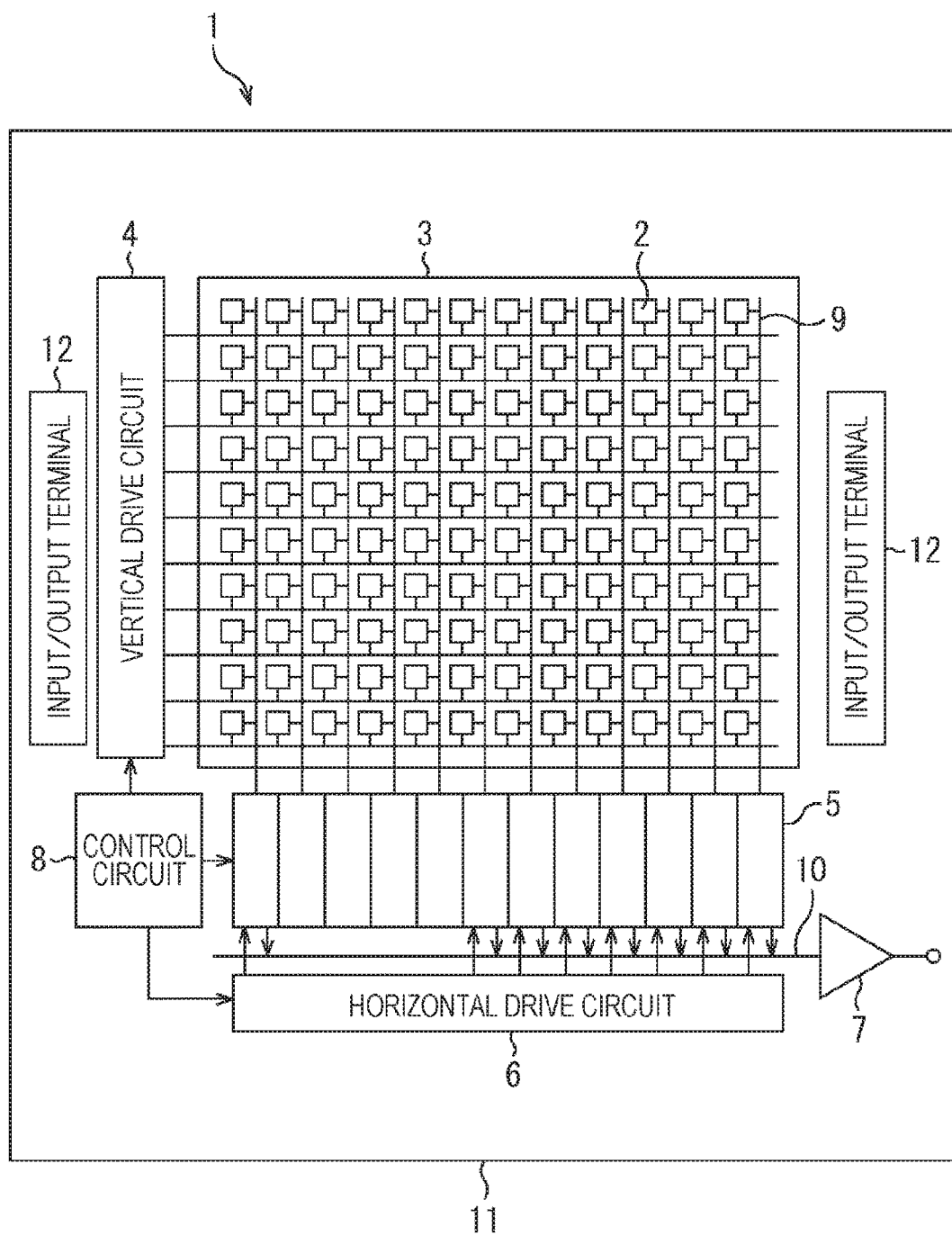
FIG. 1 is a block diagram showing a schematic configuration example of a solid-state image pickup device to which the present technology is applied.

FIG. 1 shows a schematic configuration example of an example of a complementary metal oxide semiconductor (CMOS) solid-state image pickup device, which is applied to each embodiment of the present technology.

As shown in FIG. 1, the solid-state image pickup device (element chip) 1 includes a pixel region (so-called image pickup region) 3 in which pixels 2, which include a plurality of photoelectric conversion elements, are regularly and two-dimensionally arranged on a semiconductor substrate 11 (for example, silicon substrate) and a peripheral circuit portion.

The pixel 2 includes a photoelectric conversion element (for example, photodiode) and a plurality of pixel transistors (so-called MOS transistors). The plurality of transistors may include three transistors which are, for example, a transfer transistor, a reset transistor, and an amplification transistor, and may also include four transistors by further adding a selection transistor. An equivalent circuit of each pixel 2 (unit pixel) is similar to that of ordinary one, and thus detailed description is omitted here.

Further, the pixel 2 may have a pixel shared structure. The pixel shared structure includes a plurality of photodiodes, a plurality of transfer transistors, a shared single floating diffusion, and the other pixel transistors, each of which is shared. The photodiode is a photoelectric conversion element.

The peripheral circuit portion includes a vertical drive circuit 4, a column signal processing circuit 5, a horizontal drive circuit 6, an output circuit 7, and a control circuit 8.

The control circuit 8 receives an input clock and data instructing an operation mode and the like and outputs data such as internal information of the solid-state image pickup device 1. Specifically, the control circuit 8 generates a clock signal and a control signal that will be references of operation of the vertical drive circuit 4, the column signal processing circuit 5, and the horizontal drive circuit 6 on the basis of a vertical synchronizing signal, a horizontal synchronizing signal, and a master clock. Then, the control circuit 8 inputs these signals into the vertical drive circuit 4, the column signal processing circuit 5, and the horizontal drive circuit 6.

The vertical drive circuit 4 is formed of, for example, a shift register, selects a pixel drive wiring, supplies a pulse for driving pixels 2 to the selected pixel drive wiring, and drives the pixels 2 for each row. Specifically, the vertical drive circuit 4 sequentially selects and scans each pixel 2 in the pixel region 3 for each row in the vertical direction and supplies a pixel signal based on a signal charge generated according to the amount of light received by the photoelectric conversion element of each pixel 2 to the column signal processing circuit 5 through a vertical signal line 9.

The column signal processing circuit 5 is arranged, for example, for each column of the pixels 2 and performs signal processing such as noise removal for each pixel column on a signal outputted from each pixel 2 in one row. Specifically, the column signal processing circuit 5 performs signal processing such as correlated double sampling (CDS) for removing fixed pattern noise unique to the pixels 2, signal amplification, and analog/digital (A/D) conversion. On the output stage of the column signal processing circuit 5, a horizontal selection switch (not shown in FIG. 1) is provided to connect with a horizontal signal line 10.

The horizontal drive circuit 6 is formed of, for example, a shift register, sequentially selects each of the column signal processing circuits 5 by sequentially outputting a horizontal scanning pulse, and causes each of the column signal processing circuits 5 to output a pixel signal to the horizontal signal line 10.

The output circuit 7 performs signal processing on signals sequentially supplied from each of the column signal processing circuits 5 through the horizontal signal line 10 and outputs the signals. The output circuit 7 may perform, for example, only buffering, or may perform black level adjustment, column variation correction, various digital signal processing, and the like.

An input/output terminal 12 is provided to exchange signals with external devices.

By the way, in Patent Document 1, while a vertical transistor is used to read a signal charge from the photoelectric conversion unit and transmit the signal charge to the floating diffusion layer, it is necessary to rotationally transfer the charge along the outer circumferential direction of the channel of the vertical transistor toward a portion where the floating diffusion layer is formed at the same time as transferring the charge from the photoelectric conversion unit to the floating diffusion layer in the depth direction of the substrate. When rotating the charge along the outer circumferential direction of the channel, it is difficult to obtain high transfer efficiency due to the existence of potential barrier and potential dip along the rotation direction of the channel.

When forming a vertical transistor, a groove portion extending in the depth direction of the substrate is formed and then a gate insulating film is formed by, for example, applying thermal oxidation. However, different crystal orientations are exposed in the groove, so that the oxidation rate in the thermal oxidation varies depending on the crystal orientation and a film thickness distribution occurs along an outer circumferential direction of the groove in the gate insulating film. Therefore, the potential distribution of a vertical transistor channel, which is generated when a voltage is applied to the gate electrode, varies along the outer circumferential direction of the groove, and this generates a potential barrier or a potential dip, which causes interference in charge transfer or trapping of charge.

To avoid the above phenomenon, it is considered to control impurity distribution in order to suppress the potential barrier and the potential dip. However, this requires complicated and many impurity forming processes, so that it is difficult to obtain sufficient potential controllability in addition to a problem that the number of processes increases.

Further, to suppress the film thickness distribution of the gate insulating film due to thermal oxidation, a method is considered that forms a gate insulating film by a chemical vapor deposition (CVD) method. However, even in this case, in an initial stage of a period in which the insulating film is formed, thermal oxidation inevitably occurs, so that it is difficult to form the gate insulating film with a completely uniform film thickness along the outer circumferential direction of the groove for the vertical transistor.

Therefore, in the present technology, a vertical transistor is used and a floating diffusion layer is formed so as to surround the groove portion which is a channel region of the vertical transistor. Further, a gate power supply of a reset transistor for resetting the potential of the floating diffusion layer is arranged at a position adjacent to the formed floating diffusion layer.

Thereby, it is possible to obtain high charge transfer efficiency from the photoelectric conversion unit to the floating diffusion layer.

<Configuration Example of Pixel Structure>

Figure 2:
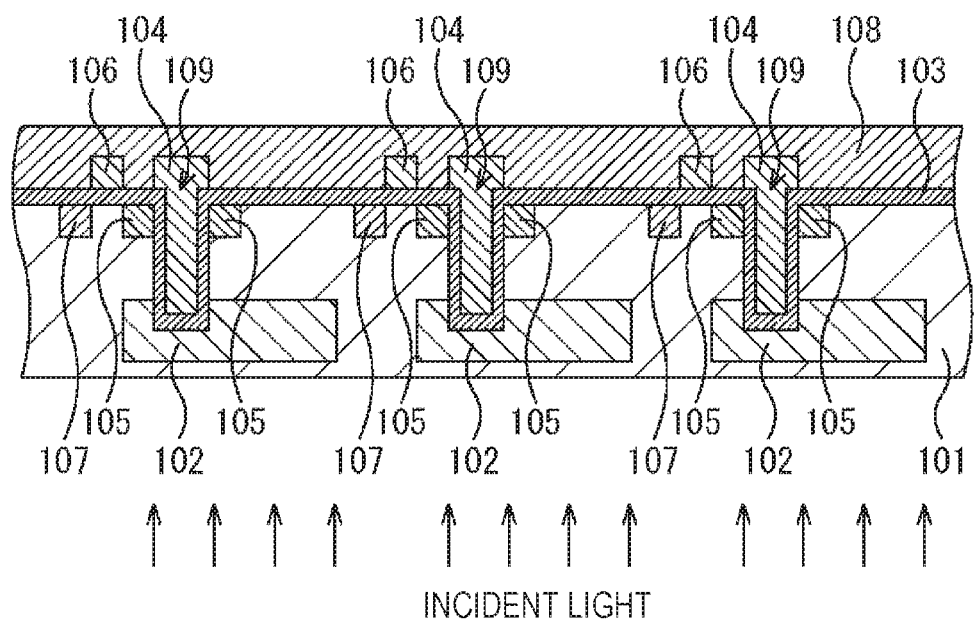
FIG. 2 is a cross-sectional view showing a first embodiment of a pixel structure of the present technology.

FIG. 2 is a cross-sectional view showing a first embodiment of a pixel structure of a solid-state image pickup device including a vertical transistor of the present technology. In the example of FIG. 2, an example of three adjacent pixels is shown. However, any number of pixels may be arranged as needed.

The pixel structure shown in FIG. 2 is formed so as to include a semiconductor substrate 101, a photodiode 102, a gate insulating film 103, a gate electrode 104, a floating diffusion layer 105, a reset gate (electrode) 106, a reset drain 107, and an insulating film 108.

In this pixel structure, a vertical transistor including the gate electrode 104 is formed on the semiconductor substrate 101, where the photodiode 102 is formed in a light incident surface, through the gate insulating film 103. Further, on a surface opposite to the light incident surface of the semiconductor substrate 101, the floating diffusion layer 105 is formed so as to surround the groove portion (hereinafter referred to as a vertical transistor groove portion) 109 which is the channel region of the vertical transistor. Further, the reset drain 107 is formed at a position adjacent to the floating diffusion layer 105 through the reset gate 106. In addition, these are flattened by the insulating film 108.

In such a pixel structure, a signal charge photoelectrically converted in the photodiode 102 is transferred by the vertical transistor to the floating diffusion layer 105 formed so as to surround the gate electrode of the vertical transistor.

By the way, although not shown in the example of FIG. 2, a color filter, microlenses, and the like may be formed as needed on the light incident surface of the solid-state image pickup device. Further, the vertical transistor for transferring the signal charge from the photodiode 102 to the floating diffusion layer 105 may be arranged so as to be in contact with an arbitrary position of the photodiode 102. In addition, the depth of the vertical transistor does not necessarily have to be deep enough for the vertical transistor to enter the photodiode, and the vertical transistor can be formed to have an arbitrary depth where a signal can be transmitted.

Figure 3:
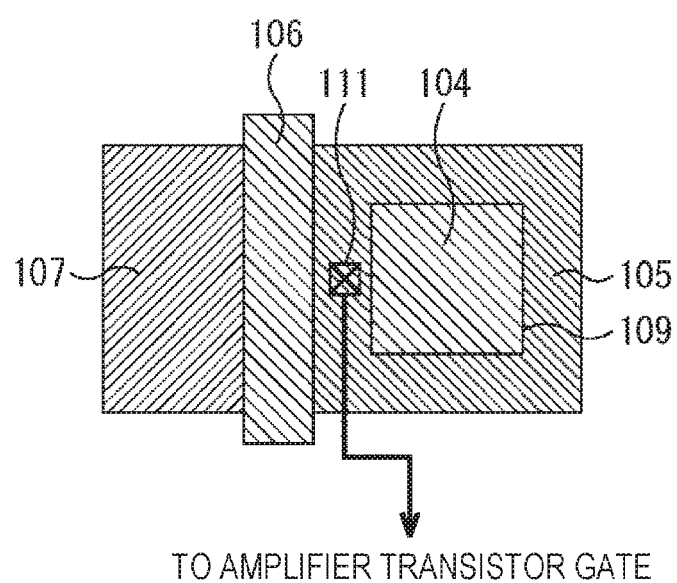
FIG. 3 is a plan view showing a first example of a layout of a floating diffusion layer of a solid-state image pickup device of FIG. 2.

FIG. 3 is a plan view showing a first example of a layout of the floating diffusion layer of the solid-state image pickup device of FIG. 2. In the example of FIG. 3, the floating diffusion layer 105 is arranged in a rectangular shape so that a groove portion 109 surrounds the gate electrode 104 of the vertical transistor having a rectangular shape.

A contact hole 111 is formed in the floating diffusion layer 105. A wiring connected to the contact hole 111 is connected to, for example, a gate electrode of an amplifier transistor (not shown in the drawings) for outputting a photoelectrically converted signal to the outside.

Further, the reset drain 107 is formed so as to be adjacent to the floating diffusion layer 105 through the reset gate 106 and a predetermined voltage is applied to the reset gate 106, so that the potential of the floating diffusion layer 105 is reset to the same potential as that of the reset drain 107.

As shown in the layout of FIG. 3, the floating diffusion layer 105 is formed so as to surround the gate electrode of the vertical transistor, so that the signal charge from the photodiode 102 is transferred to an extending direction of the channel of the vertical transistor and it is not necessary to rotate the signal charge along the outer circumference of the vertical transistor groove portion 109. Therefore, high transfer efficiency can be obtained when transferring the signal charge from the photodiode 102 to the floating diffusion layer.

By the way, in the example of FIG. 3, an example is shown in which the groove portion 109, which is the channel region of the vertical transistor, is formed in a rectangular shape. However, the groove portion 109 may be formed in a circular shape.

MODIFIED EXAMPLE

Figure 4:
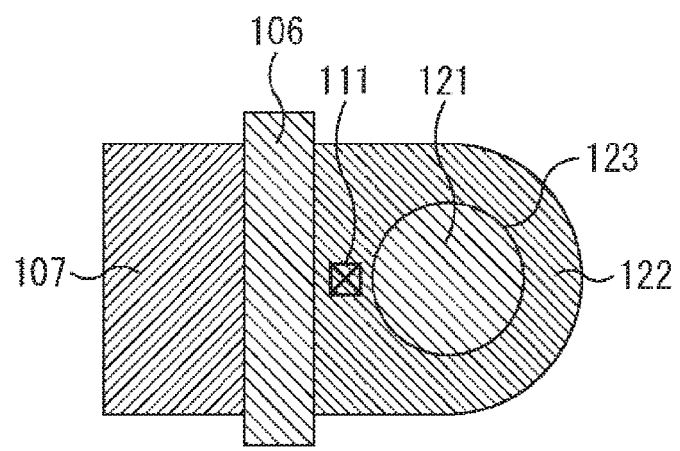
FIG. 4 is a plan view showing a second example of the layout of the floating diffusion layer of the solid-state image pickup device of FIG. 2.

FIG. 4 is a plan view showing a second example of the layout of the floating diffusion layer of the solid-state image pickup device of FIG. 2. The example of FIG. 4 is different from the example of FIG. 3 in a point that the gate electrode 104 is replaced by a gate electrode 121 and a point that the floating diffusion layer 105 is replaced by a floating diffusion layer 122. Further, the example of FIG. 4 is different from the example of FIG. 3 in a point that the vertical transistor groove portion 109 is replaced by a vertical transistor groove portion 123.

In other words, in the example of FIG. 4, the floating diffusion layer 122 is arranged so as to surround the gate electrode 121 of the vertical transistor formed in a circular shape and is formed so as to be linearly in contact with the reset gate 106. In short, the left portion of the floating diffusion layer 122 has a rectangular shape and the right portion has an arc shape.

In the layout of FIG. 4, the groove portion 123 which is the channel region of the vertical transistor is formed in a circular shape and the floating diffusion layer 122 is arranged in an arc shape so as to be along the groove portion 123. Thereby, in addition to the effect described above in FIG. 3, it is possible to reduce the volume of the floating diffusion layer 132 and improve conversion efficiency from charge to voltage.

By the way, also in the example of FIG. 4, although an example is shown in which the groove portion 123 which is the channel region of the vertical transistor is formed in a circular shape, the groove portion 123 may be formed in a rectangular shape.

Figure 5:
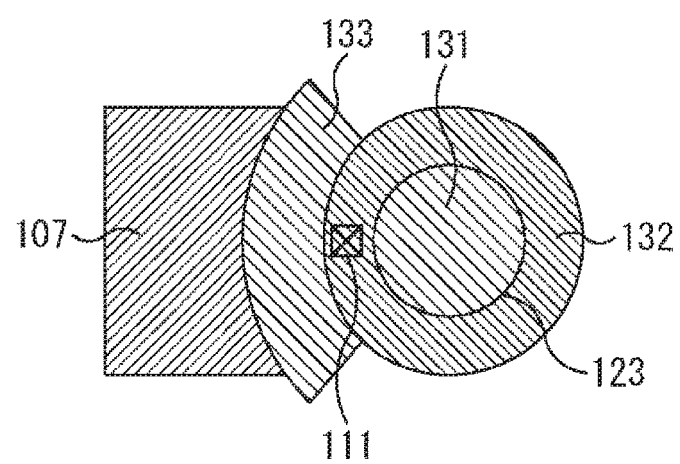
FIG. 5 is a plan view showing a third example of the layout of the floating diffusion layer of the solid-state image pickup device of FIG. 2.

FIG. 5 is a plan view showing a third example of the layout of the floating diffusion layer of the solid-state image pickup device of FIG. 2. The example of FIG. 5 is different from the example of FIG. 3 in a point that the gate electrode 104 is replaced by a gate electrode 131, a point that the floating diffusion layer 105 is replaced by a floating diffusion layer 132, and a point that the reset gate 106 is replaced by a reset gate 133. Further, the example of FIG. 5 is different from the example of FIG. 3 in a point that the vertical transistor groove portion 109 is replaced by the vertical transistor groove portion 123.

In other words, in the example of FIG. 5, the floating diffusion layer 132 is arranged in a circular shape so as to surround the gate electrode 131 of the vertical transistor formed in a circular shape. The reset gate 133 is arranged in an arc shape so as to be in contact with the floating diffusion layer 132 arranged in a circular shape.

The contact hole 111 is formed in the floating diffusion layer 132. A wiring connected to the contact hole 111 is connected to, for example, a gate electrode of an amplifier transistor (not shown in the drawings) for outputting a photoelectrically converted signal to the outside.

As shown in the layout of FIG. 5, the floating diffusion layer 132 is formed so as to surround the gate electrode of the vertical transistor, the vertical transistor groove portion 123 is formed in a circular shape, and the floating diffusion layer 132 is arranged in a circular shape so as to be along the groove portion 123. Thereby, in addition to the effect described above in FIG. 3, it is possible to reduce the volume of the floating diffusion layer 132 and improve conversion efficiency from charge to voltage.

By the way, also in the example of FIG. 5, although an example is shown in which the groove portion 123 which is the channel region of the vertical transistor is formed in a circular shape, the groove portion 123 may be formed in a rectangular shape.

Figure 6:
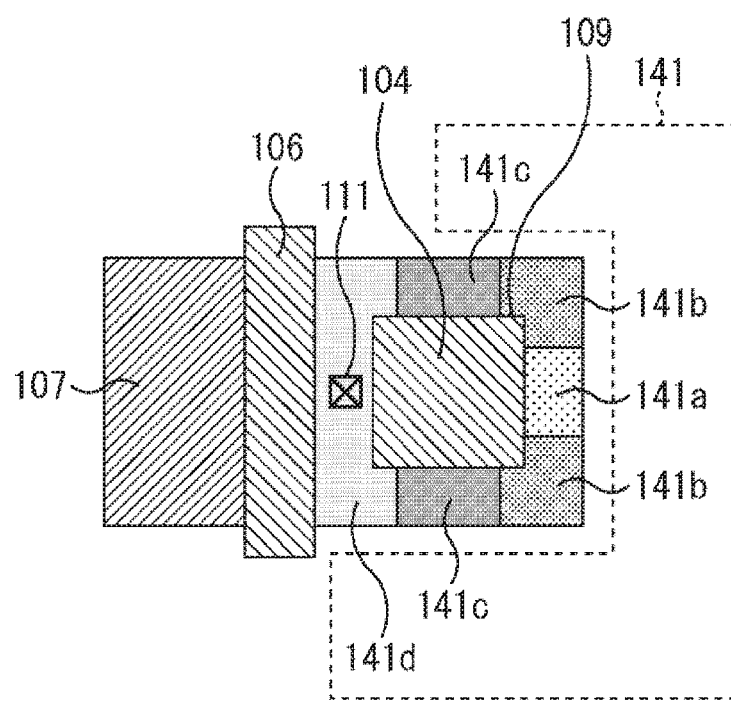
FIG. 6 is a plan view showing a fourth example of the layout of the floating diffusion layer of the solid-state image pickup device of FIG. 2.

FIG. 6 is a plan view showing a fourth example of the layout of the floating diffusion layer of the solid-state image pickup device of FIG. 2. The example of FIG. 6 is different from the example of FIG. 3 in a point that the floating diffusion layer 105 is replaced by a floating diffusion layer 141.

The floating diffusion layer 105 of FIG. 3 is formed so that the impurity density of a first conductivity type (P-type or N-type) is uniform over the entire floating diffusion layer 105. On the other hand, the floating diffusion layer 141 of FIG. 6 is formed so that the impurity density of the first conductivity type gradually increases in a direction toward a region adjacent to the reset gate 106.

Specifically, in the example of FIG. 6, the floating diffusion layer 141 is arranged in a rectangular shape so as to surround the gate electrode 104 of the vertical transistor where the groove portion 109 is formed in a rectangular shape.

Further, the floating diffusion layer 141 includes regions whose impurity densities are different from each other. Specifically, the floating diffusion layer 141 includes, in order from farthest away from the reset gate 106, a first impurity density region 141a, a second impurity density region 141b, a third impurity density region 141c, and a fourth impurity density region 141d. The floating diffusion layer 141 is formed so that the impurity density gradually increases in order from the first impurity density region 141a to the fourth impurity density region 141d. The reset gate 106 is arranged to be adjacent to the fourth impurity density region 141d.

As described above, in the solid-state image pickup device of FIG. 6, a depletion potential in the floating diffusion layer 141 has a gradient. In particular, when a reset potential is set so that the floating diffusion layer is depleted, a signal charge transferred from the photodiode 102 to the floating diffusion layer 141 is easily transferred toward the fourth impurity density region 141d where the contact hole 111 including a potential extracting portion is arranged in the floating diffusion layer 141.

As shown in the example of FIG. 6, there is an impurity density distribution in a direction in which the reset gate 106 is arranged in the floating diffusion layer 141, so that it is possible to extract the signal charge and reset the potential of the floating diffusion layer 141 at a fast response speed.

By the way, in the example of FIG. 6, the impurity density region of the floating diffusion layer of the present technology is shown to be divided and arranged into four regions. However, the impurity density region may be divided into any two or more regions, and further, the impurity density region may be formed so that the impurity density is gradually changed in a direction toward a region adjacent to the reset gate 106 in addition to a method in which the impurity density is changed for each region.

Further, although the shape of the floating diffusion layer of FIG. 6 is shown so that the density is changed with respect to the rectangular floating diffusion layer which is a planar layout of the floating diffusion layer shown in FIG. 3, it is possible to apply the density change to the arc-shaped floating diffusion layer shown in FIG. 4 and the circular-shaped floating diffusion layer shown in FIG. 5.

<Manufacturing Process of Solid-State Image Pickup Device>

Figure 7:
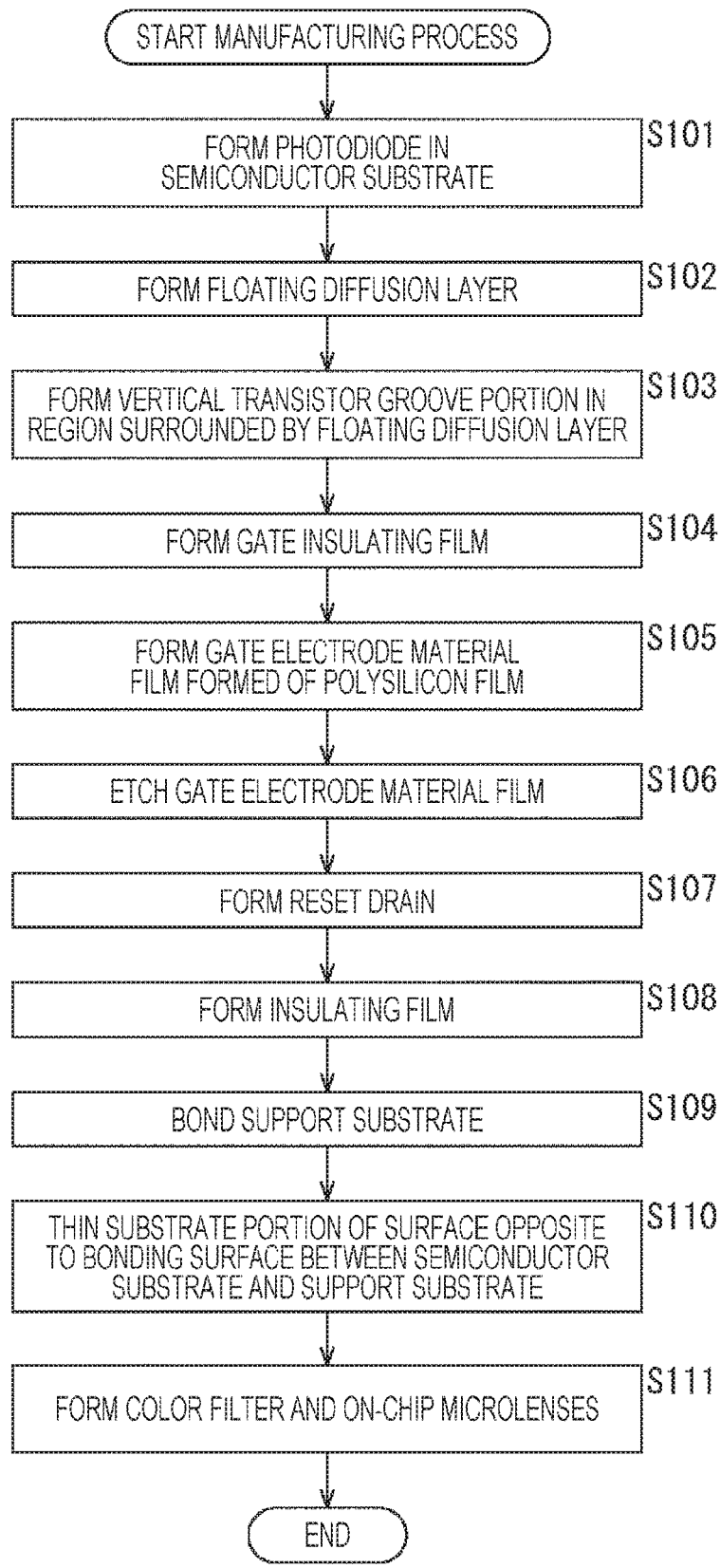
FIG. 7 is a flowchart for explaining an example of a manufacturing process of the solid-state image pickup device of the present technology.

Next, the manufacturing process of the solid-state image pickup device of the present technology will be described with reference to a flowchart of FIG. 7. Note that the manufacturing process of FIG. 7 is performed by a manufacturing device (not shown in the drawings) of the solid-state image pickup device. Hereinafter, the manufacturing process will be described also with reference to process drawings of FIGS. 8 to 12.

Figure 8:
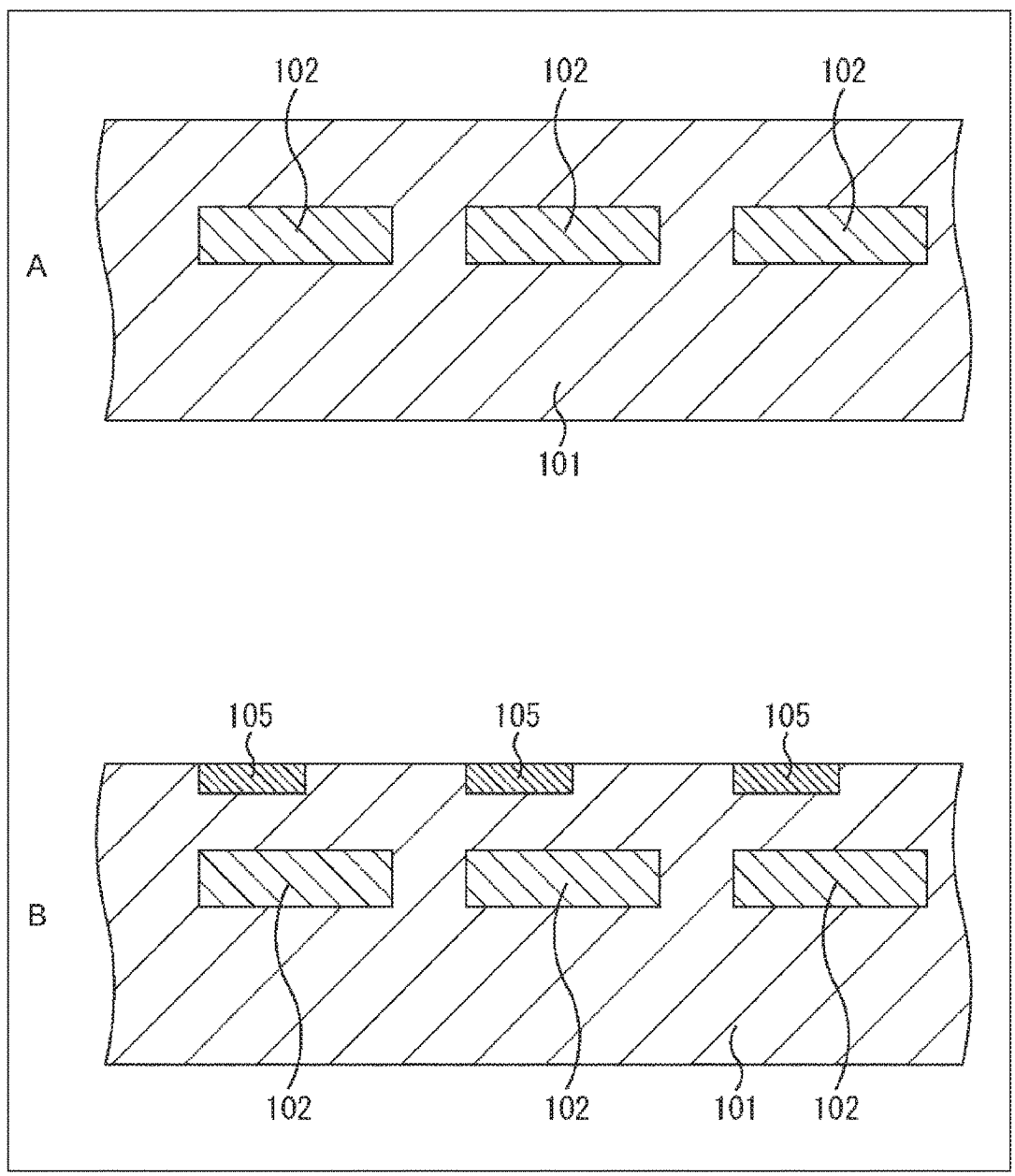
FIG. 8 is a process drawing showing an example of the manufacturing process of FIG. 7.

In step S101, the manufacturing device forms the photodiode 102 in the semiconductor substrate 101 (A of FIG. 8). In step S102, the manufacturing device forms the floating diffusion layer 105 in the semiconductor substrate 101 (B of FIG. 8).

Figure 9:
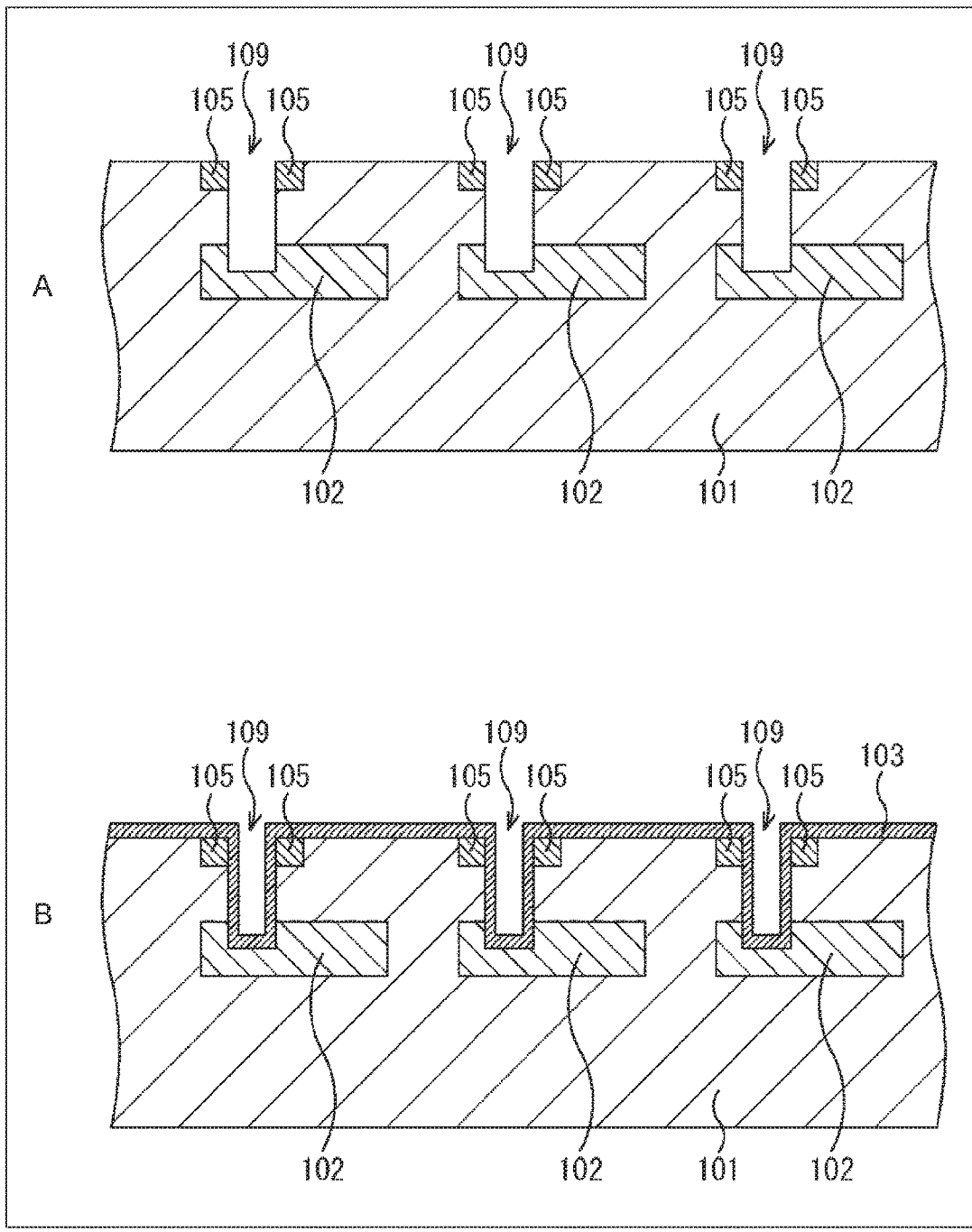
FIG. 9 is a process drawing showing an example of the manufacturing process of FIG. 7.
Figure 10:
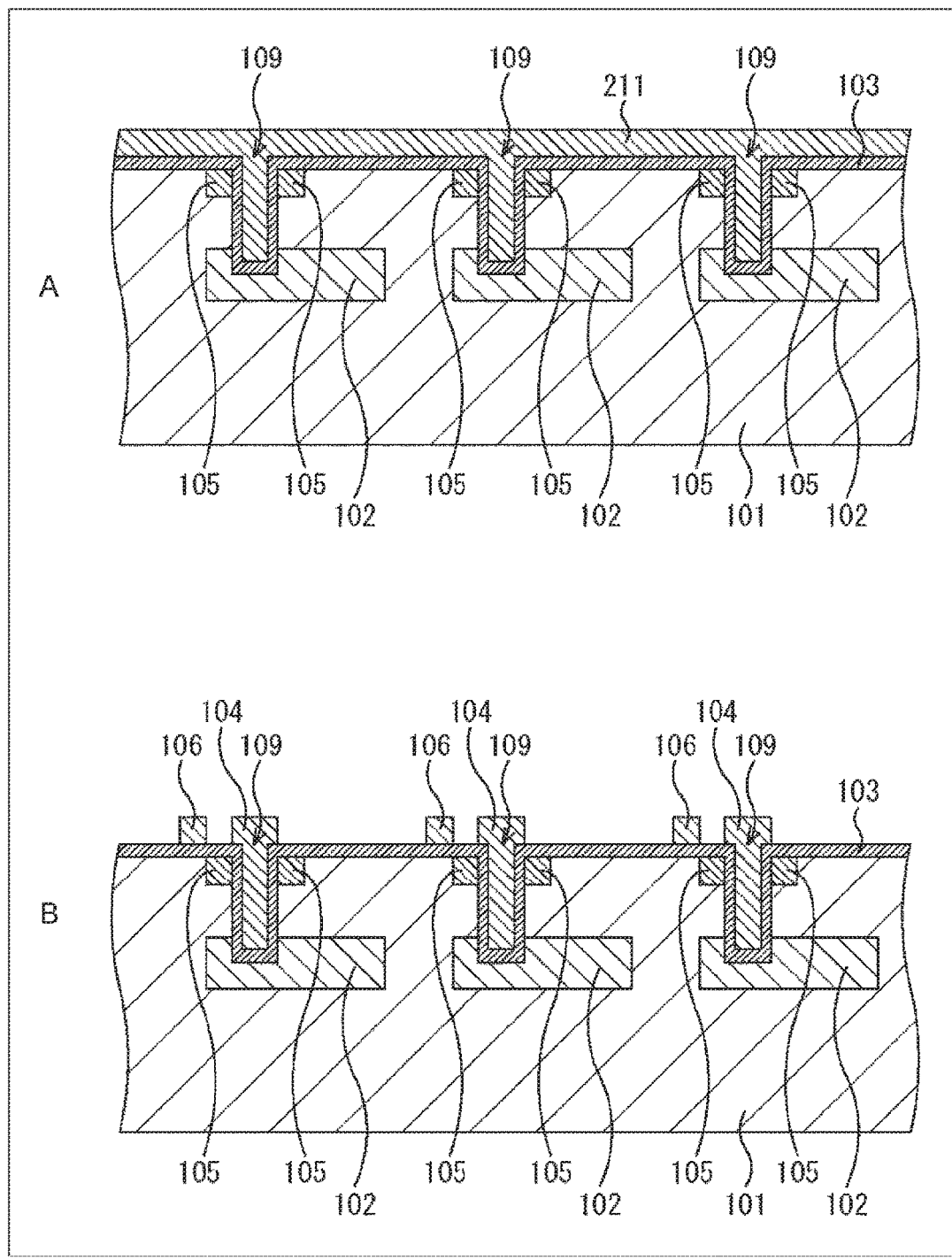
FIG. 10 is a process drawing showing an example of the manufacturing process of FIG. 7.

In step S103, the manufacturing device forms the vertical transistor groove portion 109 in a region surrounded by the floating diffusion layer 105 (A of FIG. 9). At this time, the vertical transistor groove portion 109 enters the photodiode 102 in FIG. 9. However, the vertical transistor groove portion 109 may have a depth where a signal can be read from the photodiode 102 by the vertical transistor.

In step S104, the manufacturing device forms the gate insulating film 103 inside the vertical transistor groove portion 109 and on the surface of the semiconductor substrate 101 (B of FIG. 9). In step S105, the manufacturing device forms a gate electrode material film 211 formed of, for example, a polysilicon film on the entire device (A of FIG. 10).

In step S106, the manufacturing device etches the gate electrode material film 211. Thereby, the gate electrode 104 and the reset gate 106 of the vertical transistor are formed (B of FIG. 10).

Figure 11:
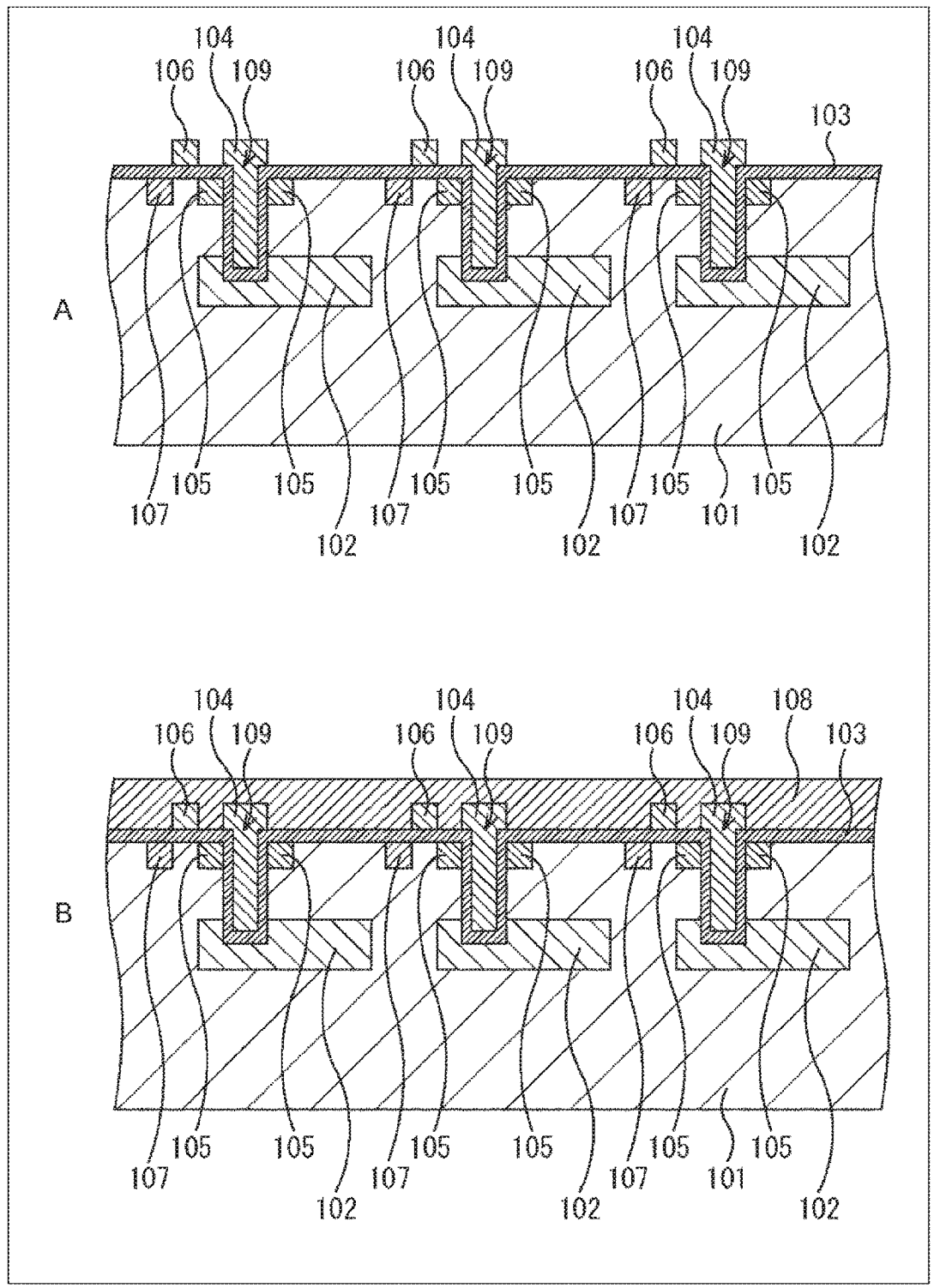
FIG. 11 is a process drawing showing an example of the manufacturing process of FIG. 7.

In step S107, the manufacturing device forms the reset drain 107 so that the reset drain 107 is adjacent to the reset gate 106 (A of FIG. 11). In step S108, the manufacturing device forms the insulating film 108 on the entire device (B of FIG. 11).

Figure 12:
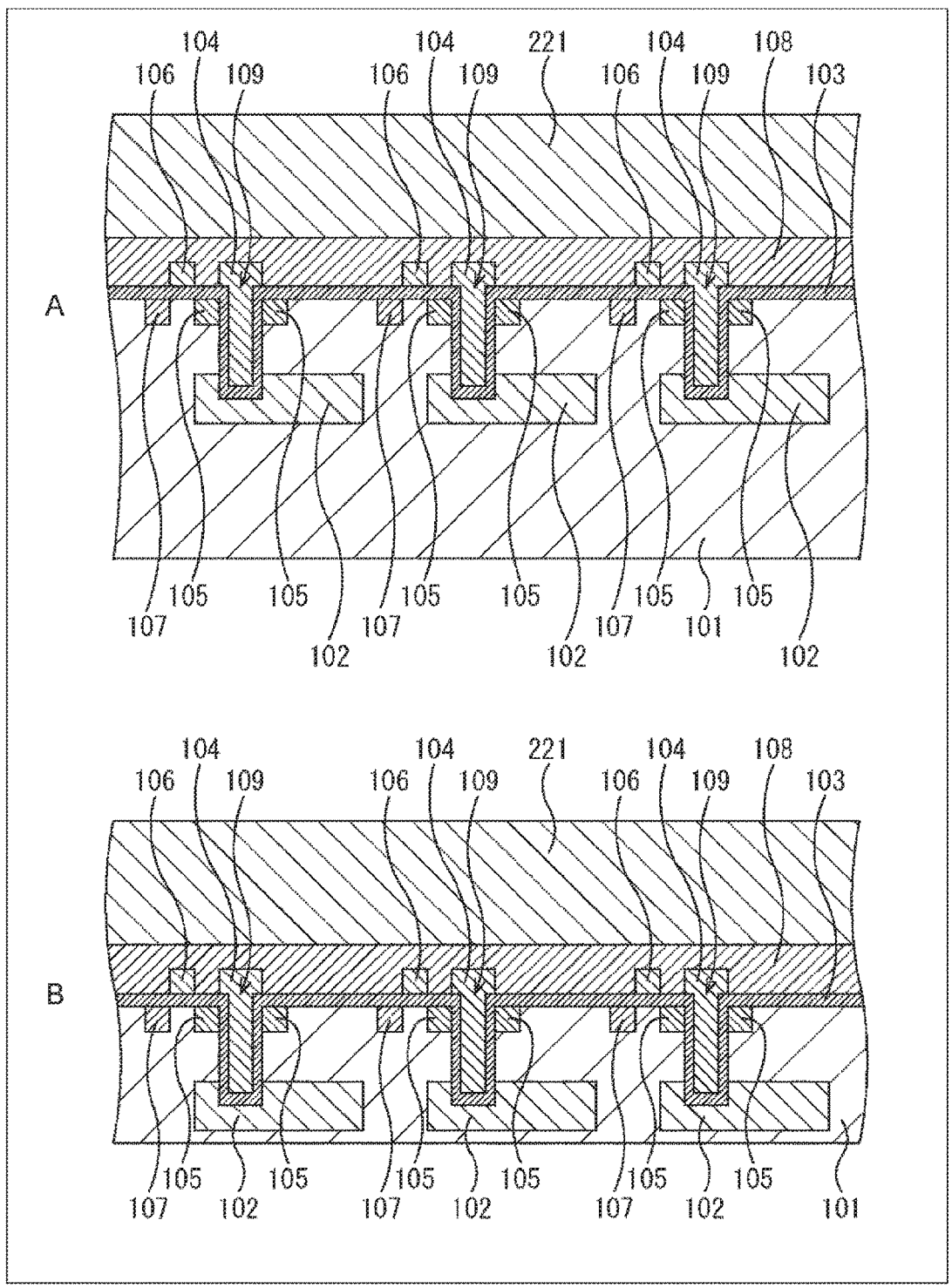
FIG. 12 is a process drawing showing an example of the manufacturing process of FIG. 7.

In step S109, the manufacturing device bonds a support substrate 221 to the semiconductor substrate 101, on which the insulating film 108 is formed, by a plasma bonding method (A of FIG. 12). In step S110, the manufacturing device thins a substrate portion of a surface opposite to a bonding surface between the semiconductor substrate 101 and the support substrate 221 by, for example, a grinding method (B of FIG. 12).

In step S111, the manufacturing device forms a color filter and on-chip microlenses, which are not shown in the drawings, on a surface of the semiconductor substrate 101 where the photodiode 102 is formed. Thereby, the solid-state image pickup device is completed.

By doing as described above, it is possible to form the floating diffusion layer so as to surround the channel of the vertical transistor.

By the way, although in step S104 in FIG. 7, it is described that the gate insulating film of the vertical transistor and the insulating film of the reset transistor are formed at the same time, they need not be formed at the same time and a different insulating film may be formed as needed. In this case, the thickness of the gate insulating film of the transistor can be set to an optimal thickness different for each transistor.

In addition, although in the manufacturing process in FIG. 7, a process example is described which forms the groove portion of the vertical transistor after forming the floating diffusion layer, it is possible to form the floating diffusion layer after forming the groove portion of the vertical transistor as described below.

Figure 13:
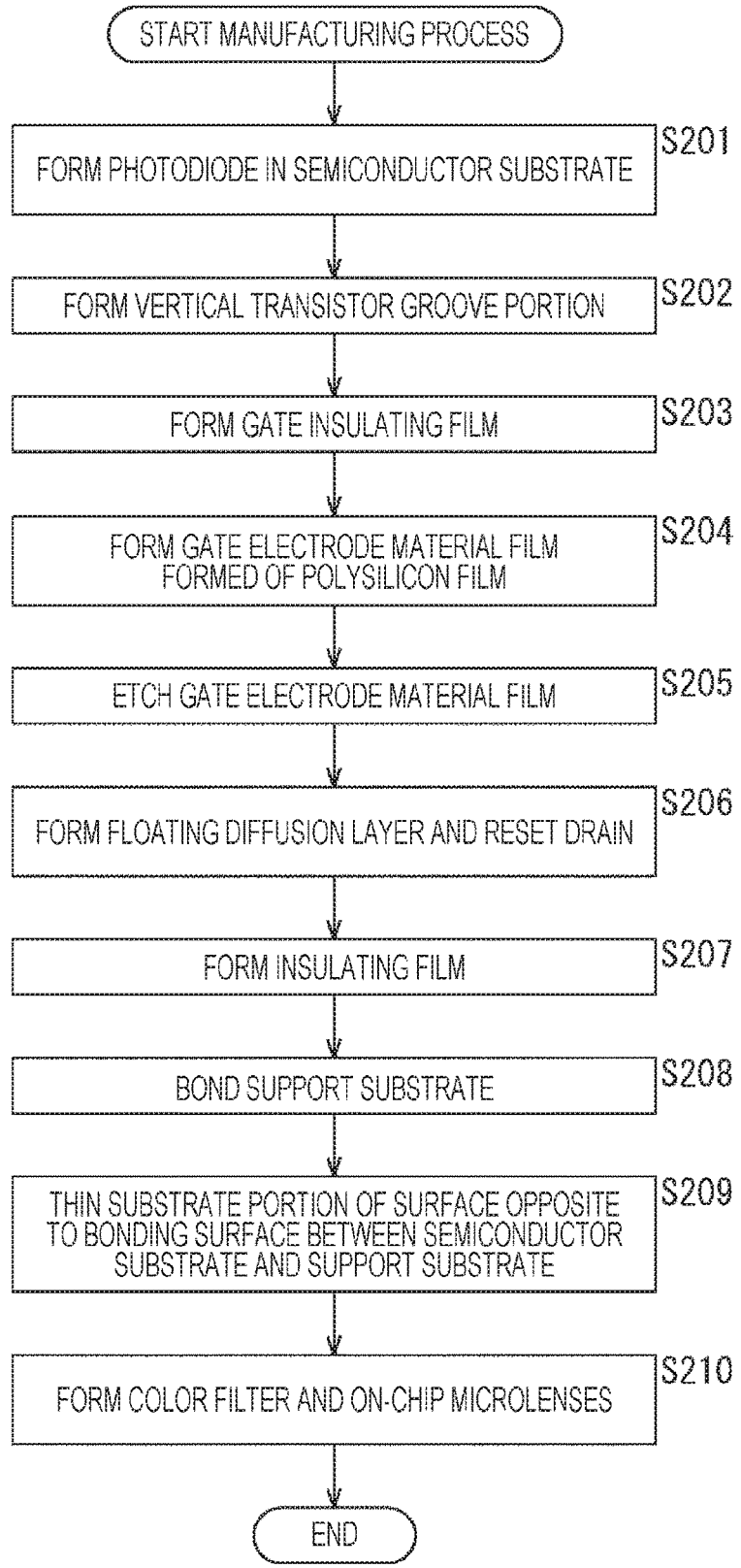
FIG. 13 is a flowchart for explaining another example of the manufacturing process of the solid-state image pickup device of the present technology.

Next, another example of the manufacturing process of the solid-state image pickup device of the present technology will be described with reference to a flowchart of FIG. 13. Note that the manufacturing process of FIG. 13 is also performed by a manufacturing device (not shown in the drawings) of the solid-state image pickup device. Hereinafter, the other example of the manufacturing process will be described also with reference to process drawings of FIGS. 14 to 18.

Figure 14:
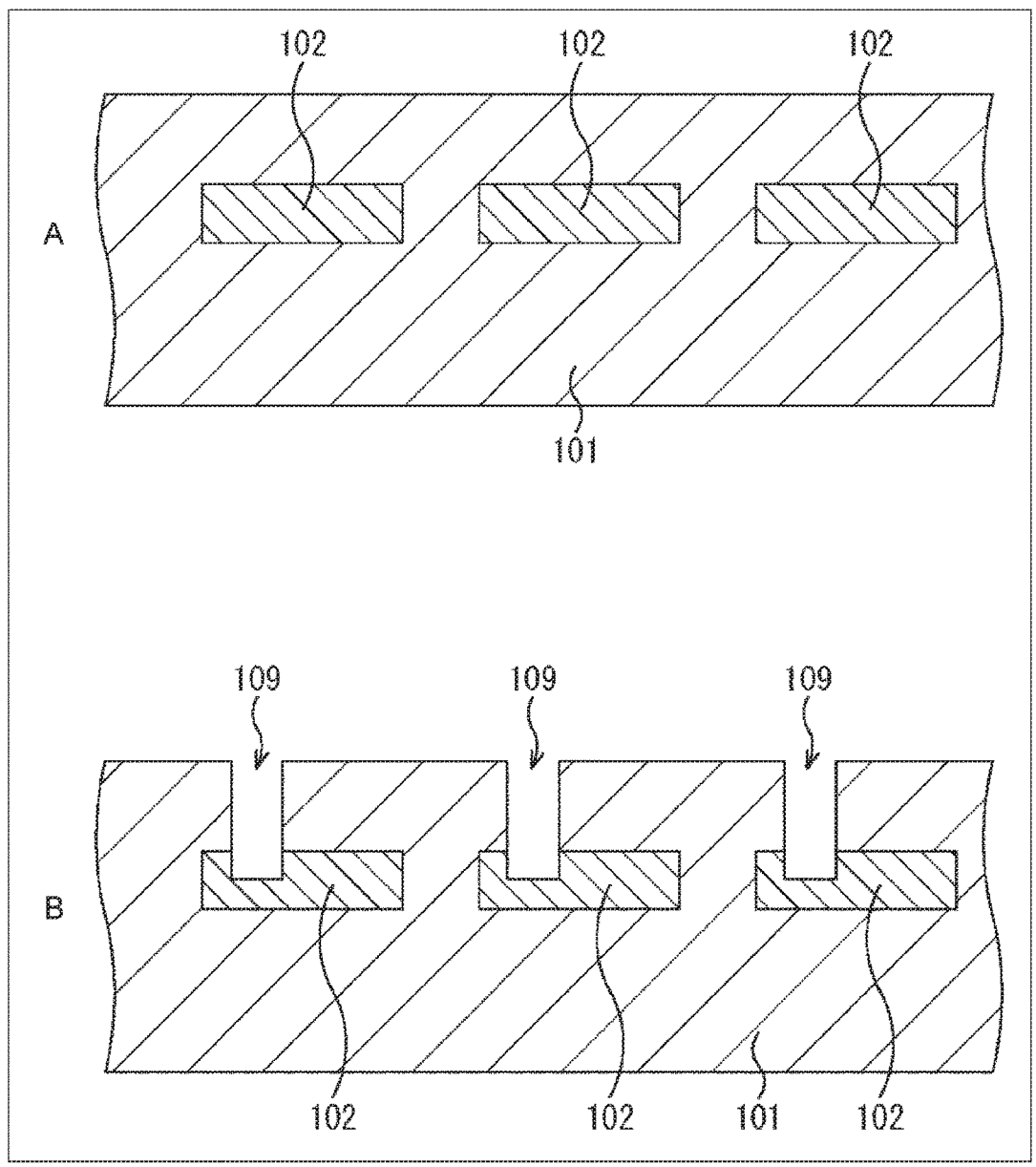
FIG. 14 is a process drawing showing an example of the manufacturing process of FIG. 13.

In step S201, the manufacturing device forms the photodiode 102 in the semiconductor substrate 101 (A of FIG. 14).

In step S202, the manufacturing device forms the vertical transistor groove portion 109 (B of FIG. 14). At this time, the vertical transistor groove portion 109 enters the photodiode 102 in FIG. 14. However, the vertical transistor groove portion 109 may have a depth where a signal can be read from the photodiode 102 by the vertical transistor.

Figure 15:
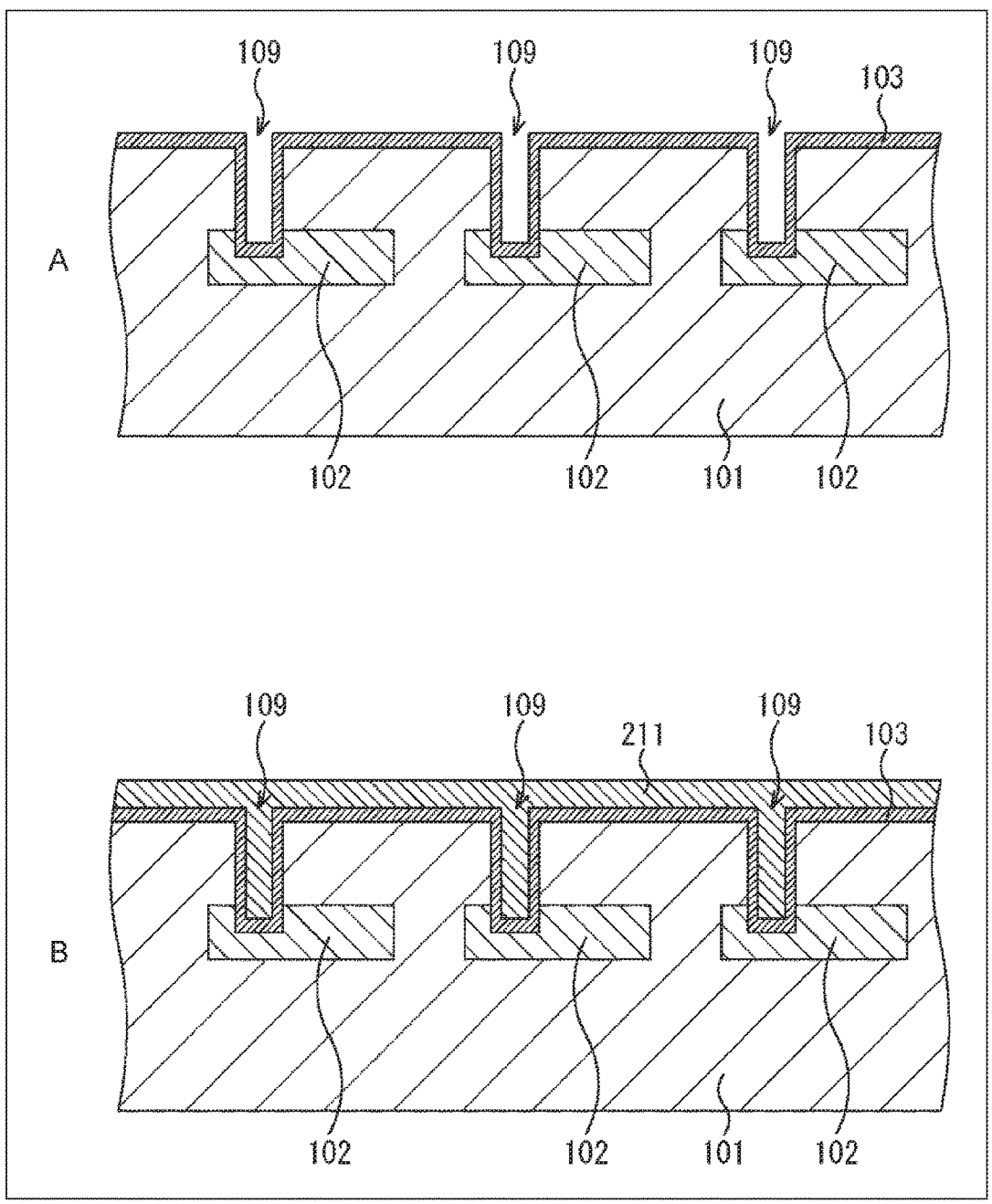
FIG. 15 is a process drawing showing an example of the manufacturing process of FIG. 13.

In step S203, the manufacturing device forms the gate insulating film 103 inside the vertical transistor groove portion 109 and on the surface of the semiconductor substrate 101 (A of FIG. 15). In step S204, the manufacturing device forms a gate electrode material film 211 formed of, for example, a polysilicon film on the entire device (B of FIG. 15).

In step S205, the manufacturing device etches the gate electrode material film 211. Thereby, the gate electrode 104 and the reset gate 106 of the vertical transistor are formed (A of FIG. 16).

Figure 16:
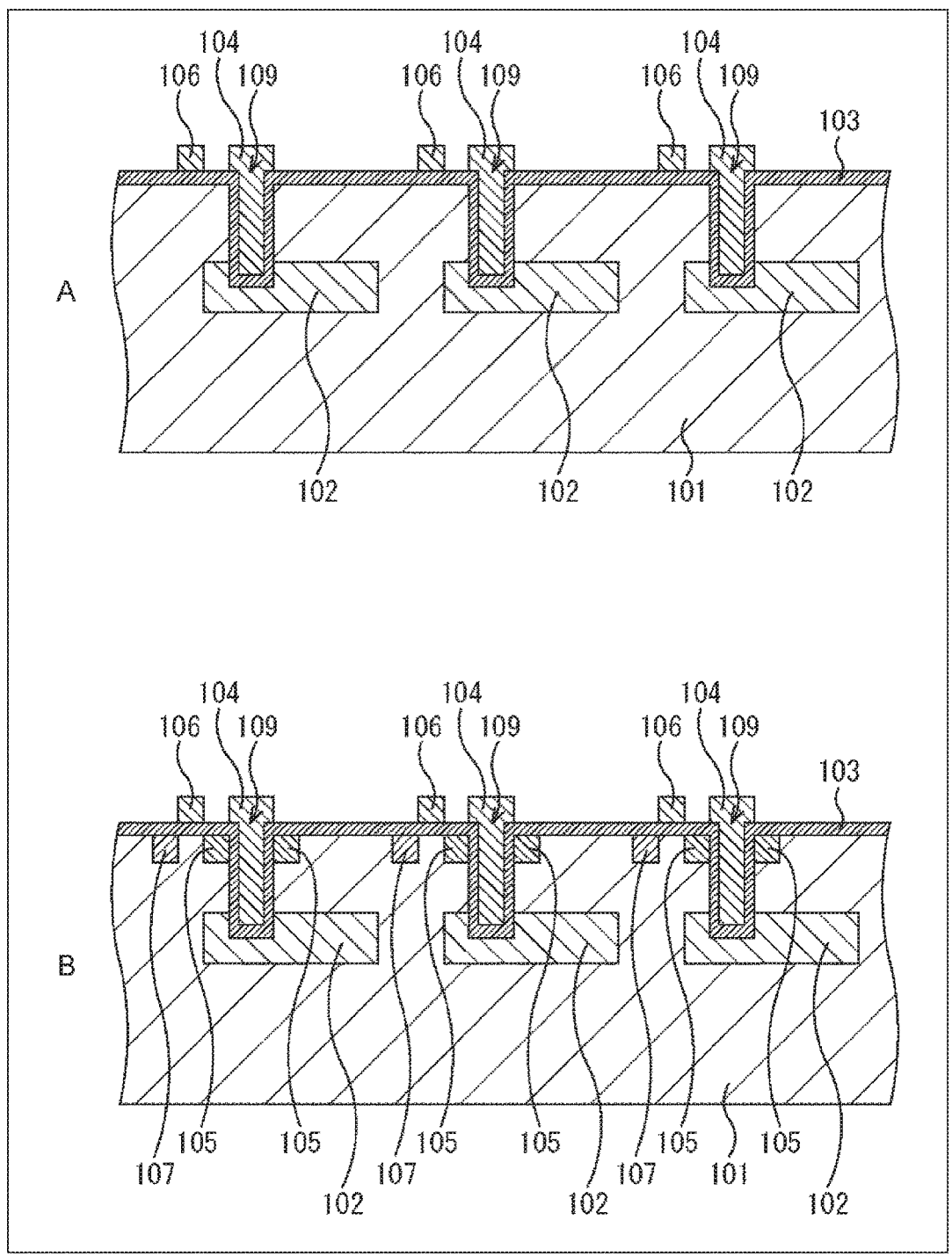
FIG. 16 is a process drawing showing an example of the manufacturing process of FIG. 13.

In step S206, the manufacturing device forms the floating diffusion layer 105 and the reset drain 107 (B of FIG. 16). At this time, the floating diffusion layer 105 and the reset drain 107 are formed by performing ion implantation to the gate electrode 104 and the reset gate 106 of the vertical transistor in a self-aligning manner.

By the way, in B of FIG. 16, it is described that the type of the floating diffusion layer 105 is formed by performing ion implantation in a self-aligning manner with the gate electrode of the vertical transistor. However, depending on a forming position of the vertical transistor gate on the semiconductor substrate 101, the ion implantation is performed from an oblique direction so that ion enters a region below the gate electrode. Thereby, it is possible to form a region to be the floating diffusion layer below a region to be a visor of the gate electrode.

Figure 17:
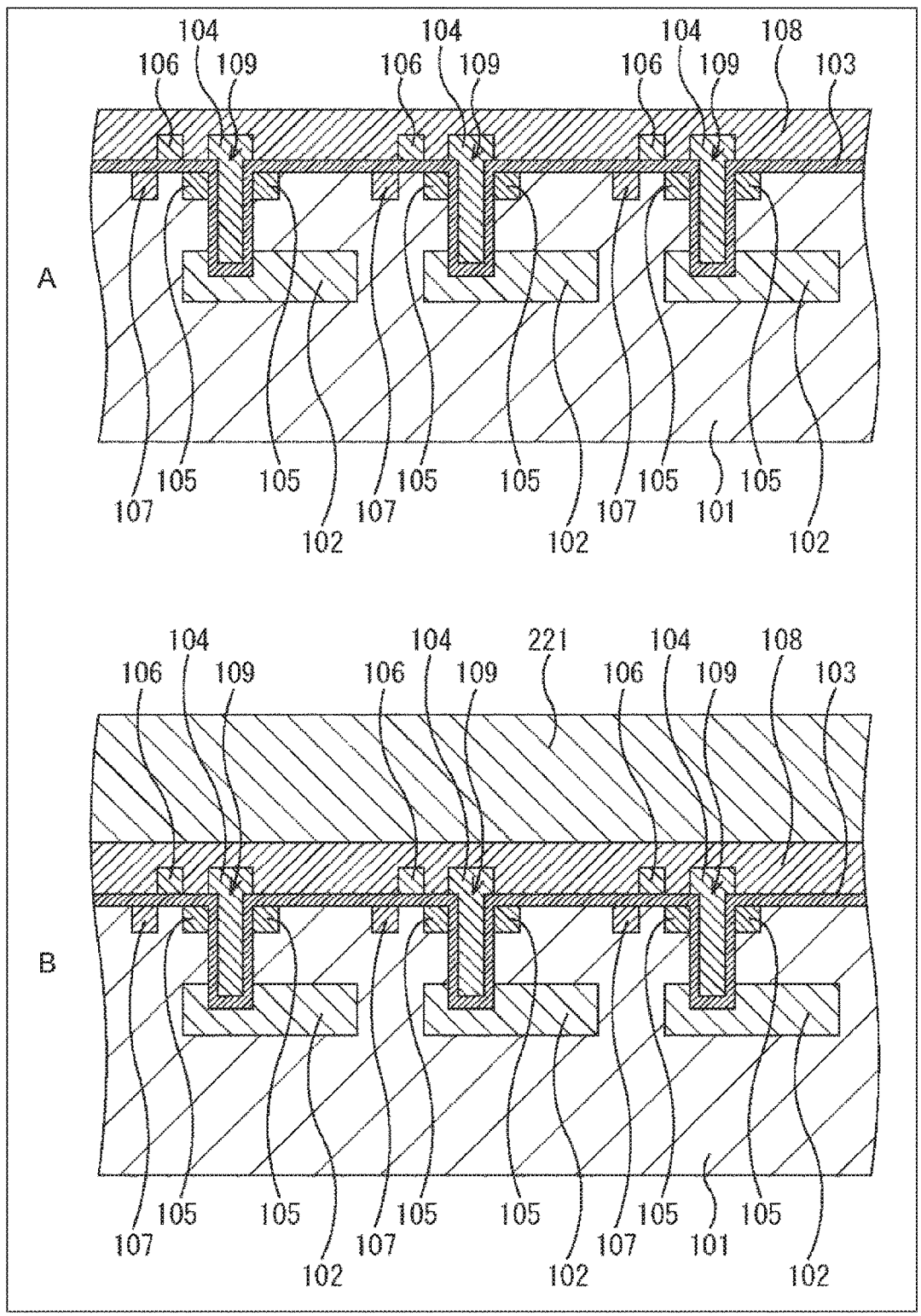
FIG. 17 is a process drawing showing an example of the manufacturing process of FIG. 13.

In step S207, the manufacturing device forms the insulating film 108 on the entire device (A of FIG. 17). In step S208, the manufacturing device bonds a support substrate 221 to the semiconductor substrate 101, on which the insulating film 108 is formed, by a plasma bonding method (B of FIG. 17).

Figure 18:
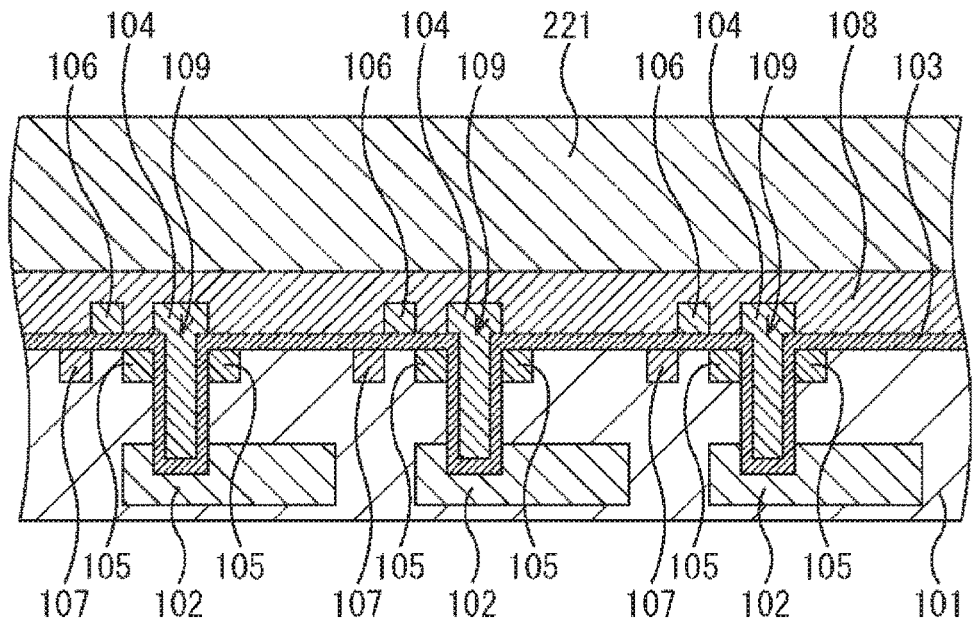
FIG. 18 is a process drawing showing an example of the manufacturing process of FIG. 13.

In step S209, the manufacturing device thins a substrate portion of a surface opposite to a bonding surface between the semiconductor substrate 101 and the support substrate 221 by, for example, a grinding method (FIG. 18).

In step S210, the manufacturing device forms a color filter and on-chip microlenses, which are not shown in the drawings, on a surface of the semiconductor substrate 101 where the photodiode 102 is formed. Thereby, the solid-state image pickup device is completed.

By the way, although also in step S203 in FIG. 13, it is described that the gate insulating film of the vertical transistor and the insulating film of the reset transistor are formed at the same time, they need not be formed at the same time and a different insulating film may be formed as needed. In this case, the thickness of the gate insulating film of the transistor can be set to an optimal thickness different for each transistor.

As described above, the floating diffusion layer is formed so as to surround the channel of the vertical transistor. Therefore, a heat treatment process after that is reduced. Thereby, it is possible to suppress spread of the floating diffusion layer due to heat diffusion, so that it is possible to reduce the volume of the floating diffusion layer and improve conversion efficiency from charge to voltage.

Further, it is possible to form the floating diffusion layer by self-aligning with the reset gate, so that it is possible to suppress variation of reset voltage.

<Another Configuration Example of Pixel Structure>

Figure 19:
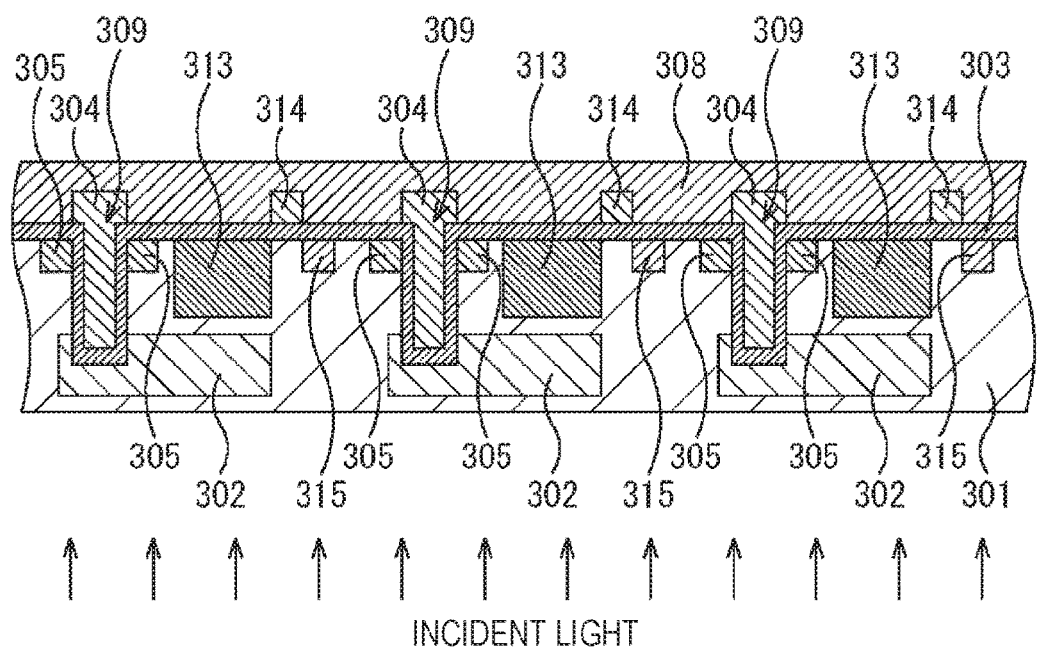
FIG. 19 is a cross-sectional view showing a second embodiment of a pixel structure of the present technology.

FIG. 19 is a cross-sectional view showing a second embodiment of the pixel structure of the solid-state image pickup device including the vertical transistor of the present technology. In the example of FIG. 19, an example of three adjacent pixels is shown. However, any number of pixels may be arranged as needed.

The pixel structure shown in FIG. 19 is formed so as to include a semiconductor substrate 301, a first photodiode 302, a gate insulating film 303, a first signal charge reading electrode 304, a first floating diffusion layer 305, an insulating film 308, a vertical transistor groove portion 309, a second photodiode 313, a second signal charge reading electrode 314, and a second floating diffusion layer 315.

In this pixel structure, as a unit pixel region, the first photodiode 302 and the second photodiode 313 are laminated and formed. To read a signal charge from the first photodiode 302 to the first floating diffusion layer 305, a vertical transistor including the first signal charge reading electrode 304 is formed through the gate insulating film 303. Furthermore, the first floating diffusion layer is formed so as to surround the vertical transistor groove portion 309.

Further, a signal charge from the second photodiode 313 is read to the second floating diffusion layer 315 through the second signal charge reading electrode 314.

In the pixel structure shown in FIG. 19, it is possible to obtain the intensity of light having different wavelengths, that is, a color signal without forming a color filter, by using a difference of light absorption rate in a depth direction by laminating and forming a plurality of photodiodes.

At this time, in the present technology, the vertical transistor is used to read a signal charge from the first photodiode formed on a substrate surface of the light incident surface far from a reading circuit unit among the laminated photodiodes, and the first floating diffusion layer is formed so as to surround the vertical transistor groove portion.

Thereby, it is possible to improve reading efficiency of the signal charge from the first photodiode to the first floating diffusion layer.

By the way, in the example of FIG. 19, an example is shown in which two diodes are laminated. However, the number of laminated diodes is not limited to two, and may be three or four.

As described above, according to the present technology, in the backside illumination type solid-state image pickup device that reads the signal charge from the photoelectric conversion unit to the floating diffusion layer by using the vertical transistor, the floating diffusion layer is arranged so as to surround the gate electrode of the vertical transistor. Thereby, it is possible to obtain high charge transfer efficiency from the photoelectric conversion unit to the floating diffusion layer.

In addition, although a configuration in which the present technology is applied to a CMOS solid-state image pickup device is described in the above description, the present technology may be applied to a solid-state image pickup device such as a charge coupled device (CCD) solid-state image pickup device.

In addition, the present technology is not limited to application to a solid-state image pickup device, but can be applied to an image pickup device. Here, the image pickup device means a camera system such as a digital still camera and a digital video camera and an electronic apparatus having an image pickup function such as a mobile phone. In addition, a module-like form that is mounted in an electronic apparatus, that is, a camera module, may be defined as an image pickup device.

<Configuration Example of Electronic Apparatus>

Figure 20:
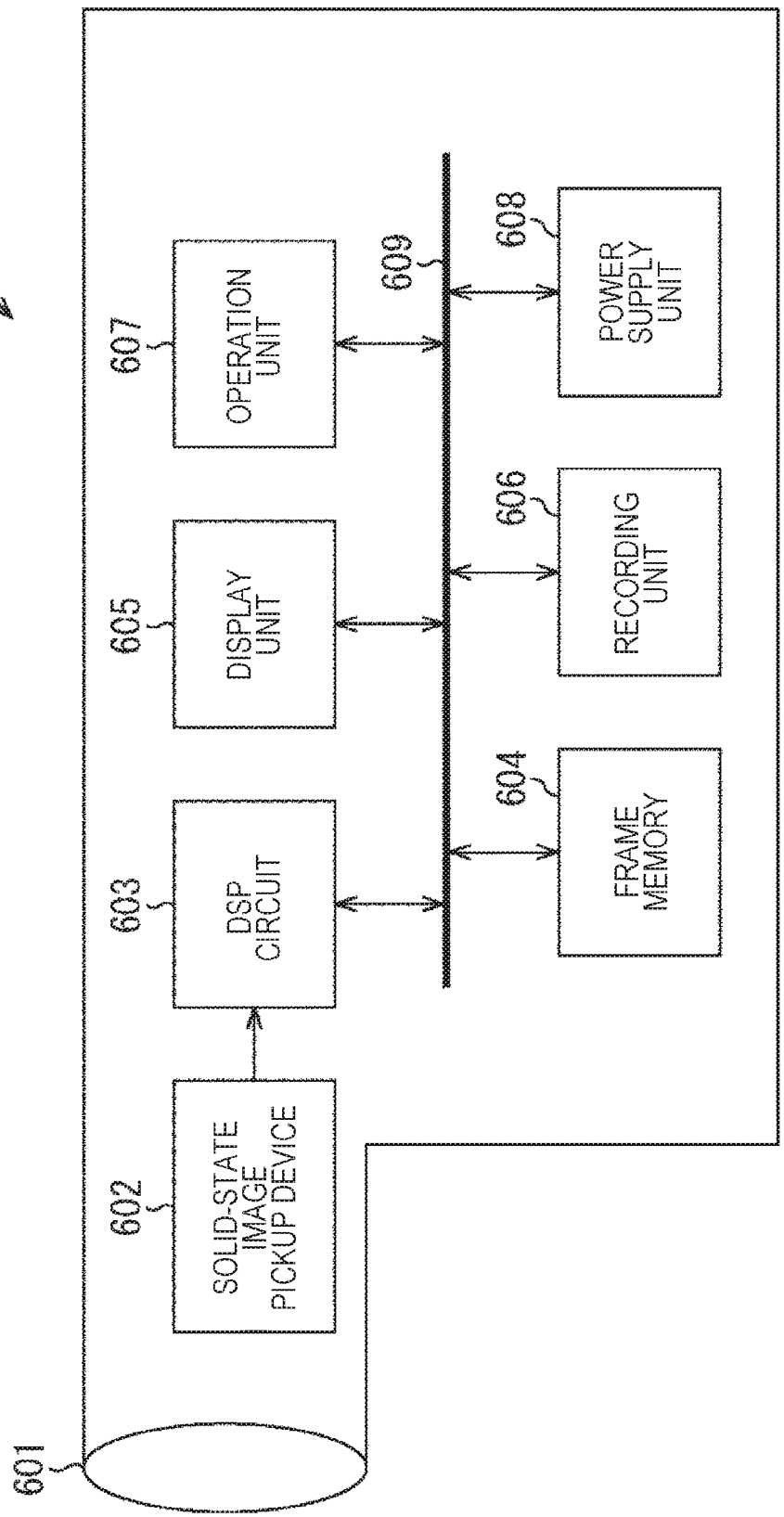
FIG. 20 is a block diagram showing a configuration example of an electronic apparatus to which the present technology is applied.

FIG. 20 is a block diagram showing a configuration example of a camera device, which is an electronic apparatus to which the present technology is applied.

The camera device 600 of FIG. 20 includes an optical unit 601 including a lens group and the like, a solid-state image pickup device (image pickup device) 602 in which each structure of the present technology is employed, and a DSP circuit 603 which is a camera signal processing circuit. Further, the camera device 600 includes a frame memory 604, a display unit 605, a recording unit 606, an operation unit 607, and a power supply unit 608. The DSP circuit 603, the frame memory 604, the display unit 605, the recording unit 606, the operation unit 607, and the power supply unit 608 are connected to each other through a bus line 609.

The optical unit 601 receives incident light (image light) from a subject and forms an image on an image pickup surface of the solid-state image pickup device 602. The solid-state image pickup device 602 converts the amount of incident light that is formed into the image on the image pickup surface by the optical unit 601 into an electric signal for each pixel and outputs the electric signal as a pixel signal. It is possible to use the solid-state image pickup device according to the embodiment described above as the solid-state image pickup device 602.

The display unit 605 is formed of, for example, a panel type display device such as a liquid crystal panel and an organic electro luminescence (EL) panel, and displays a moving image or a still image picked up by the solid-state image pickup device 602. The recording unit 606 records a moving image or a still image picked up by the solid-state image pickup device 602 into a recording medium such as a video tape and a digital versatile disk (DVD).

The operation unit 607 issues an operation instruction for various functions included in the camera device 600 under control of a user. The power supply unit 608 appropriately supplies various power supplies, which are operation power supplies for the DSP circuit 603, the frame memory 604, the display unit 605, the recording unit 606, and the operation unit 607, to these supply targets.

By the way, in the present description, the steps that describe a series of processes described above include not only processes performed in time-series along the described order, but also processes performed in parallel or individually, which are not necessarily performed in time-series.

In addition, the embodiments of the present disclosure are not limited to the embodiments described above and may be variously modified without departing from the scope of the present disclosure.

In addition, the steps described in the above flowcharts not only can be performed by one device, but also can be shared and performed by a plurality of devices.

Further, when a plurality of processes are included in one step, the plurality of processes included in the step not only can be performed by one device, but also can be shared and performed by a plurality of devices.

In addition, in the above description, a configuration described as one device (or one processing unit) may be divided and configured as a plurality of devices (or processing units). In an opposite manner, a configuration described as a plurality of devices (or processing units) may be integrated and configured as one device (or one processing unit). In addition, of course, a configuration other than those described above may be added to a configuration of each device (or each processing unit). Further, a part of configuration of a certain device (or processing unit) may be included in a configuration of another device (or another processing unit) as long as the configuration and operation of the entire system are substantially the same. That is to say, the present technology is not limited to the embodiments described above, but may be variously modified without departing from the scope of the present technology.

While the preferred embodiments of the present disclosure have been described with reference to the drawings, the disclosure is not limited to the embodiments. It is obvious that a person with an ordinary skill in the art to which the present disclosure pertains can make various changes or modifications of the embodiments within the technical idea described in the claims, and of course, it is understood that these changes or modifications are within the technical scope of the present disclosure.

In addition, the present technology can have configurations as described below.

(1) A solid-state image pickup device including:
a vertical transistor that performs charge transfer from a photoelectric conversion unit formed in a semiconductor substrate to a floating diffusion layer; and
the floating diffusion layer that is formed so as to surround a groove portion which is a channel region of the vertical transistor.

(2) The solid-state image pickup device according to (1),
wherein a gate electrode of a reset transistor for resetting a potential of the floating diffusion layer is arranged at a position adjacent to the floating diffusion layer.

(3) The solid-state image pickup device according to (1) or (2),
wherein an impurity density of the floating diffusion layer is formed to be uniform over an entire region of the floating diffusion layer.

(4) The solid-state image pickup device according to (1) or (2),
wherein an impurity density of the floating diffusion layer is formed so as to gradually increase toward a region adjacent to the gate electrode of the reset transistor.

(5) The solid-state image pickup device according to any of (1) to (4),
wherein a cross-sectional shape of the groove portion is circular.

(6) The solid-state image pickup device according to any of (1) to (4),
wherein a cross-sectional shape of the groove portion is rectangular.

(7) The solid-state image pickup device according to any of (1) to (6),
wherein a planar shape of the floating diffusion layer formed so as to surround the groove portion is rectangular.

(8) The solid-state image pickup device according to any of (1) to (6),
wherein a part of a planar shape of the floating diffusion layer formed so as to surround the groove portion is arc-shaped.

(9) The solid-state image pickup device according to any of (1) to (6),
wherein a planar shape of the floating diffusion layer formed so as to surround the groove portion is circular.

(10) A manufacturing method performed by a manufacturing device, the manufacturing method including:
forming a photoelectric conversion unit in a semiconductor substrate; and
forming a groove portion and a floating diffusion layer in the semiconductor substrate in which the photoelectric conversion unit is formed so that the groove portion to be a channel region of a vertical transistor that performs charge transfer from the photoelectric conversion unit to the floating diffusion layer is surrounded by the floating diffusion layer.

(11) The manufacturing method according to (10), further including:
forming a floating diffusion layer in the semiconductor substrate in which the photoelectric conversion unit is formed; and
forming a groove portion to be a channel region of a vertical transistor in the formed floating diffusion layer.

(12) The manufacturing method according to (10), further including:
forming a groove portion to be a channel region of a vertical transistor in the semiconductor substrate in which the photoelectric conversion unit is formed; and
forming a floating diffusion layer so as to surround the formed groove portion.

(13) An electronic apparatus including:
a solid-state image pickup device including
a vertical transistor that performs charge transfer from a photoelectric conversion unit formed in a semiconductor substrate to a floating diffusion layer, and
the floating diffusion layer that is formed so as to surround a groove portion which is a channel region of the vertical transistor;
a signal processing circuit that processes an output signal outputted from the solid-state image pickup device; and
an optical system that projects incident light into the solid-state image pickup device.

REFERENCE SIGNS LIST

1 Solid-state image pickup device
2 Pixel
101 Semiconductor substrate
102 Photodiode
103 Gate insulating film
104 Gate electrode
105 Floating diffusion layer
106 Reset gate
107 Reset drain
108 Insulating film
109 Vertical transistor groove portion
121 Floating diffusion layer
122 Floating diffusion layer
123 Vertical transistor groove portion
211 Gate electrode material film
221 Support substrate

What is claimed is:
1. A solid-state image pickup device comprising:
a vertical transistor that performs charge transfer from a photoelectric conversion unit formed in a semiconductor substrate to a floating diffusion layer, wherein the floating diffusion layer surrounds a groove portion that is a channel region of the vertical transistor, and wherein the floating diffusion layer entirely surrounds the groove portion in a plan view.

2. The solid-state image pickup device according to claim 1,
wherein a gate electrode of a reset transistor for resetting a potential of the floating diffusion layer is arranged at a position adjacent to the floating diffusion layer.

3. The solid-state image pickup device according to claim 2,
wherein an impurity density of the floating diffusion layer is formed to be uniform over an entire region of the floating diffusion layer.

4. The solid-state image pickup device according to claim 2,
wherein an impurity density of the floating diffusion layer is formed so as to gradually increase toward a region adjacent to the gate electrode of the reset transistor.

5. The solid-state image pickup device according to claim 1,
wherein a cross-sectional shape of the groove portion is circular.

6. The solid-state image pickup device according to claim 1,
wherein a cross-sectional shape of the groove portion is rectangular.

7. The solid-state image pickup device according to claim 1,
wherein a planar shape of the floating diffusion layer formed so as to surround the groove portion is rectangular.

8. The solid-state image pickup device according to claim 1,
wherein a part of a planar shape of the floating diffusion layer formed so as to surround the groove portion is arc-shaped.

9. The solid-state image pickup device according to claim 1,
wherein a planar shape of the floating diffusion layer formed so as to surround the groove portion is circular.

10. The solid-state image pickup device according to claim 1,
wherein a cross-sectional shape of the groove portion is circular in the plan view.

11. The solid-state image pickup device according to claim 1,
wherein a cross-sectional shape of the groove portion is rectangular in the plan view.

12. A manufacturing method comprising:
forming a photoelectric conversion unit in a semiconductor substrate; and
forming a groove portion and a floating diffusion layer in the semiconductor substrate, wherein the groove portion is a channel region of a vertical transistor that performs charge transfer from the photoelectric conversion unit to the floating diffusion layer, and wherein the floating diffusion layer entirely surrounds the groove portion in a plan view.

13. The manufacturing method according to claim 12, wherein the groove portion is formed in the formed floating diffusion layer.

14. The manufacturing method according to claim 12,
wherein a cross-sectional shape of the groove portion is circular.

15. The manufacturing method according to claim 12,
wherein a cross-sectional shape of the groove portion is rectangular.

16. The manufacturing method according to claim 12,
wherein a planar shape of the floating diffusion layer formed so as to surround the groove portion is rectangular.

17. The manufacturing method according to claim 12,
wherein a planar shape of the floating diffusion layer formed so as to surround the groove portion is circular.

18. An electronic apparatus comprising:
a solid-state image pickup device including:
a vertical transistor that performs charge transfer from a photoelectric conversion unit formed in a semiconductor substrate to a floating diffusion layer, wherein the floating diffusion layer surrounds a groove portion that is a channel region of the vertical transistor;
a signal processing circuit that processes an output signal outputted from the solid-state image pickup device; and
an optical system that projects incident light into the solid-state image pickup device,
wherein the floating diffusion layer entirely surrounds the groove portion in a plan view.

* * * * *